(12) United States Patent
Gologhlan et al.

(10) Patent No.: US 6,221,164 B1
(45) Date of Patent: Apr. 24, 2001

(54) METHOD OF IN-SITU CLEANING FOR LPCVD TEOS PUMP

(75) Inventors: Fuodoor Gologhlan, Campell; David Chi, Sunnyvale; Kent Kuohua Chang, Cupertino; Hector Serrato, Ceres, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/491,213

(22) Filed: Jan. 25, 2000

(51) Int. Cl.[7] ............... C23C 16/00; H01L 21/31; H01L 21/469
(52) U.S. Cl. ............... 118/719; 118/715; 438/758
(58) Field of Search .................. 118/715, 719; 438/758

(56) References Cited

U.S. PATENT DOCUMENTS

| | | | |
|---|---|---|---|
| Re. 36,925 | * 10/2000 | Ohba et al. ............... | 134/1 |
| 4,747,368 | 5/1988 | Brien et al. ............... | 118/715 |
| 5,362,526 | 11/1994 | Wang et al. ............... | 427/573 |
| 5,405,445 | 4/1995 | Kumada et al. ............ | 118/719 |
| 5,755,886 | 5/1998 | Wang et al. ............... | 118/715 |
| 5,964,947 | 10/1999 | Zhao et al. ............... | 118/715 |

* cited by examiner

Primary Examiner—John F. Niebling
Assistant Examiner—Alexander G. Ghyka
(74) Attorney, Agent, or Firm—Amin & Turocy, LLP

(57) ABSTRACT

In one embodiment, the present invention relates to a method of cleaning a low pressure chemical vapor deposition apparatus having TEOS material build-up therein involving contacting the low pressure chemical vapor deposition apparatus with a composition containing at least one lower alcohol. In another embodiment, the present invention relates to a system for cleaning a low pressure chemical vapor deposition apparatus having TEOS material build-up therein, containing a supply of a composition comprising at least one lower alcohol; an injection port for introducing the composition comprising at least one lower alcohol into the low pressure chemical vapor deposition apparatus; and a pump/vacuum system for removing crystallized TEOS material build-up from the low pressure chemical vapor deposition apparatus.

17 Claims, 3 Drawing Sheets

METHOD OF IN-SITU CLEANING FOR LPCVD TEOS PUMP

TECHNICAL FIELD

The present invention generally relates to improved LPCVD processing. In particular, the present invention relates to reducing unwanted build-up in LPCVD pump systems thereby permitting temporary process stops without the potential for lock-up and substantially increasing the time intervals between servicing an LPCVD pump system.

BACKGROUND ART

Chemical vapor deposition (CVD) involves the formation of a solid film on a substrate by the reaction of vapor phase chemicals that contain the required constituents. The reactant gases are introduced into a reactant chamber and are decomposed and reacted at a heated surface to form the film. CVD techniques are widely employed in the fabrication of semiconductor structures; therefore, CVD techniques are some of the fundamental building blocks in semiconductor processing. Low pressure chemical vapor deposition (LPCVD) techniques involve, as the name implies, low pressures and are advantageous in that films having high purity, excellent uniformity, and conformal step coverage are obtainable. LPCVD techniques are disadvantageous in that high temperatures are typically required.

Another disadvantage associated with LPCVD processes involves the formation of tetraethylorthosilicate (TEOS) or $Si(OC_2H_5)_4$ films (or silicon dioxide layers made from TEOS starting material). During the LPCVD TEOS film formation process, the starting gas is continuously introduced into the reactor vessel, but a vacuum is continuously drawn from the reactor vessel through a vacuum extraction system connected to thereto, so that a predetermined low pressure is maintained in the reactor vessel to properly control the growth of the TEOS film. In many instances, the starting gas is not completely used in the formation of the TEOS film, and a large part thereof is undesirably pulled from the reactor vessel into the vacuum extraction system. As a result, the pump/vacuum system responsible for the low pressures, such as a mechanical booster pump, a rotary pump, a blower, and other related pump system elements, are damaged by the deposition therein of the starting gas pulled from the reactor vessel. In particular, the starting gas pulled from the reactor vessel is undesirably deposited in the pumps thereby creating an unwanted build-up in an interior of the vacuum extraction system. TEOS byproducts also create an unwanted build-up in an interior of the vacuum extraction system. TEOS material build-up is characterized by a very sticky film. This is problematic because the build-up on internal surfaces of the LPCVD apparatus and particularly on internal movable parts of the pumps requires frequent vigorous cleanings.

Moreover, TEOS is particularly problematic in LPCVD processes because TEOS gas condenses in the vicinity of 35° C. Problems ensue when an LPCVD TEOS film formation process is temporarily stopped, such as during evening hours or during a power glitch causing the pump to shut off. In particular, after the LPCVD apparatus is turned off, the apparatus cools down to room temperatures from its high operating temperatures. Since TEOS gas condenses around 35° C., TEOS materials build-up on various elements of the LPCVD apparatus including the pump/vacuum system as the temperature of the LPCVD apparatus cools down. Upon turning the LPCVD apparatus back on, blower vains, rotors and other elements of the pump/vacuum system cannot function properly due to the solid build-up of TEOS material. In many instances, within only 30 minutes after stopping and LPCVD TEOS film formation process, TEOS material builds-up so extensively that it is impossible to turn the LPCVD apparatus back on. Although it is sometimes desirable to temporarily interrupt the LPCVD TEOS film formation process in order to make minor process adjustments, such interruptions are avoided due to the possibility that the LPCVD apparatus cannot be turned back on.

Cleaning a pump/vacuum system in an LPCVD TEOS film formation process requires one to disconnect the pump/vacuum system from the LPCVD apparatus, disassemble the pump/vacuum system, clean the individual parts, reassemble the pump/vacuum system, connect the pump/vacuum system back to the LPCVD apparatus, and testing the cleaned system. This cleaning process typically takes three to four days, which is a long period of time to be off-line. Not only is this cleaning process cumbersome, but the LPCVD apparatus is rendered useless during the long cleaning time, thus inhibiting further semiconductor processing.

SUMMARY OF THE INVENTION

The present invention provides an improved LPCVD process by enabling the in situ cleaning of the pump/vacuum system of the LPCVD apparatus. The cleaning is in situ in that the LPCVD apparatus is cleaned without having to disconnect and disassemble the pump/vacuum system while running. The present invention also provides methods for minimizing the accumulation of TEOS material in the pump/vacuum system of the LPCVD apparatus. As a result of the present invention, LPCVD processing is capabilities are lengthened, temporary stops in LPCVD processing are facilitated, and cumbersome cleaning of the pump/vacuum system of the LPCVD apparatus is minimized and/or eliminated.

In one embodiment, the present invention relates to a method of cleaning an LPCVD apparatus having TEOS material build-up therein involving contacting the LPCVD apparatus with a composition containing at least one lower alcohol.

In another embodiment, the present invention relates to a method of reducing TEOS material build-up from interior surfaces of a pump/vacuum system of an LPCVD apparatus having a first amount of TEOS material build-up involving contacting the pump/vacuum system of the LPCVD apparatus with a composition containing at least one lower alcohol under a pressure from about 0.001 Torr to about 800 Torr to provide the pump/vacuum system of the LPCVD apparatus having a second amount of TEOS material build-up, wherein the second amount of TEOS material build-up is at least about 75% by weight less than the first amount of TEOS material build-up.

In yet another embodiment, the present invention relates to an LPCVD method involving the steps of depositing TEOS on a first semiconductor substrate in an LPCVD apparatus; removing the first semiconductor substrate from the LPCVD apparatus; injecting a composition containing at least one lower alcohol into the LPCVD apparatus; and depositing TEOS on a second semiconductor substrate in the LPCVD apparatus.

In still yet another embodiment, the present invention relates to a system for cleaning a low pressure chemical vapor deposition apparatus having TEOS material build-up therein, containing a supply of a composition comprising at least one lower alcohol; an injection port for introducing the composition comprising at least one lower alcohol into the low pressure chemical vapor deposition apparatus; and a pump/vacuum system for removing crystallized TEOS material build-up from the low pressure chemical vapor deposition apparatus.

DISCLOSURE OF INVENTION

Figure 1A:
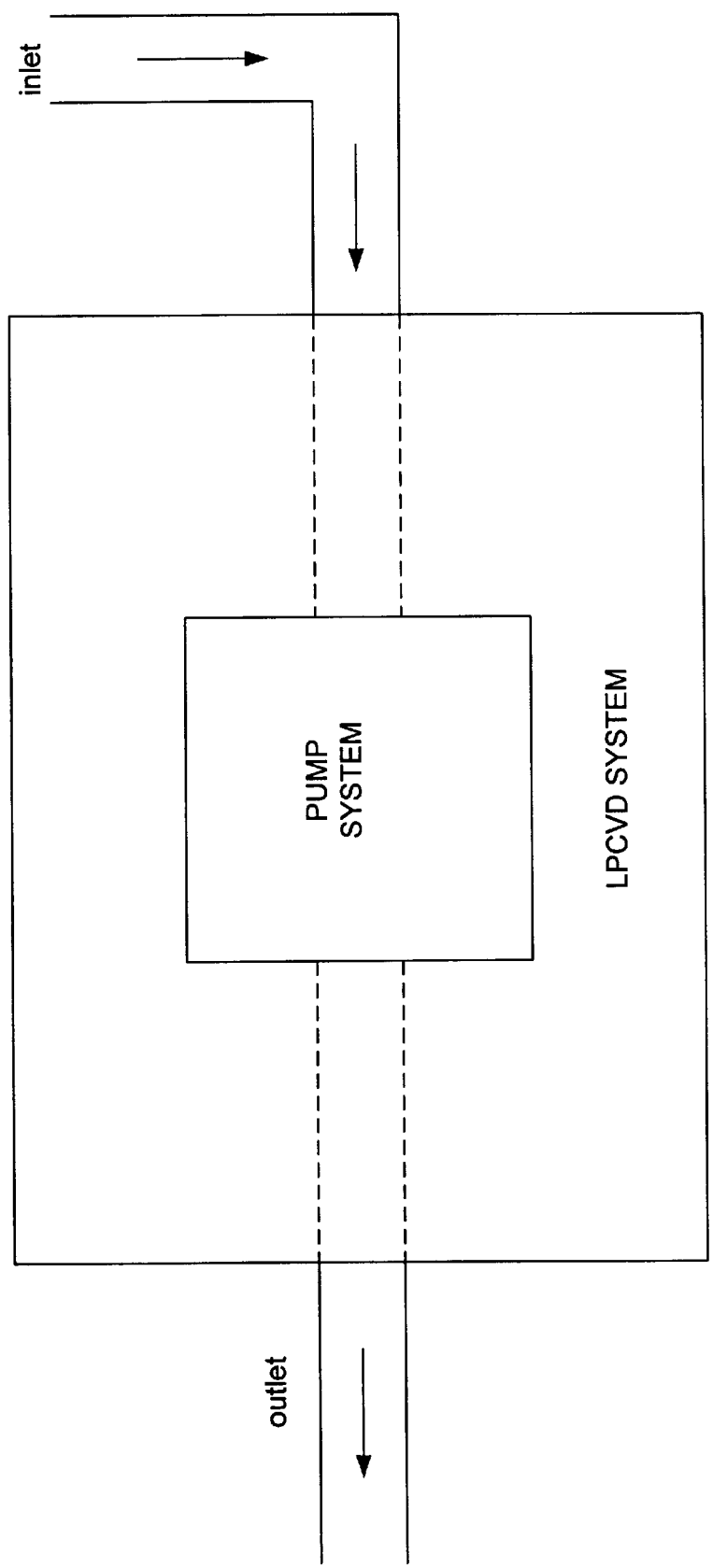
FIGS. 1A, 1B and 1C are schematic representations of systems for cleaning a low pressure chemical vapor deposition apparatus having TEOS material build-up therein according to three aspects, respectively, of the present invention.

The present invention involves improving LPCVD TEOS processing by reducing unwanted TEOS material build-up in a LPCVD apparatus using a lower alcohol. Unwanted TEOS material build-up includes TEOS that is formed on the interior surfaces of the LPCVD apparatus, and particularly on the interior surfaces of the pump/vacuum system of the LPCVD apparatus, as well as TEOS starting materials and byproducts formed on these interior surfaces during the formation of a TEOS layer. The starting materials when forming a TEOS layer include TEOS and inert gases. LPCVD TEOS processing also includes the formation of a silicon dioxide layer where TEOS is employed as a starting material therefor.

The present invention involves any CVD apparatus that employs low pressures. Low pressures are pressures below about 10 Torr. In another embodiment, low pressures are pressures below about 1 Torr. Typically, CVD apparatuses that employ low pressures are LPCVD apparatuses, but CVD apparatuses that employ low pressures further include plasma enhanced chemical vapor deposition (PECVD) apparatuses that employ pressures below about 10 Torr. For convenience, these apparatuses are collectively referred to as LPCVD apparatuses. LPCVD apparatuses are known in the art, and are commercially available. There is no limitation with regard to the type of LPCVD apparatus employed.

The LPCVD apparatus is equipped with a pump/vacuum system that establishes and maintains the low pressure conditions within a reaction/deposition chamber where a substance is formed on a substrate (such as a TEOS layer over a wafer substrate). Pump systems, vacuum systems, extraction systems and the like for CVD apparatuses are known in the art, and are commercially available. There is no limitation with regard to the type of pump/vacuum system employed.

One or more lower alcohols are contacted with the LPCVD apparatus and in particular with the pump/vacuum system of the LPCVD apparatus in any suitable manner. While not wishing to be bound by any theory, it is believed that the lower alcohol crystallizes the sticky TEOS material build-up and the crystallized build-up vaporizes, which is then removed from the LPCVD apparatus through the pump/vacuum system. The amount of lower alcohol is primarily dependent upon the amount of TEOS material build-up on/in the LPCVD apparatus and in particular on/in the pump/vacuum system of the LPCVD apparatus. Prior to contact with the lower alcohol composition, semiconductor substrates for receiving CVD materials are removed from the LPCVD apparatus.

Lower alcohols are alcohols containing from 1 to about 6 carbon atoms. In another embodiment, lower alcohols contain from about 2 to about 4 carbon atoms. Lower alcohols may be represented by the formula $R(OH)_x$, wherein R is an organic group containing from 1 to about 6 carbon atoms, such as an alkyl group containing from 1 to about 6 carbon atoms, and x is an integer from 1 to about 3. Examples of lower alcohols include methanol, ethanol, n-propanol, isopropanol, n-butanol, isobutanol, t-butyl alcohol, pentanol, t-pentyl alcohol, neopentanol, hexanol, cyclohexanol, 3-methyl-2-pentanol, and mixtures of two or more thereof.

A composition containing the lower alcohol is contacted with the TEOS material build-up. In one embodiment, the lower alcohol composition contacted with the TEOS material build-up is in the form of a liquid. In another embodiment, the lower alcohol composition contacted with the TEOS material build-up is in the form of a gas. In yet another embodiment, the lower alcohol composition contacted with the TEOS material build-up is in the form of a mixture of a plasma and a gas.

One or more lower alcohols are contacted with the TEOS material build-up for a time sufficient for the lower alcohol to reduce, minimize and/or eliminate TEOS material build-up on the interior surfaces of the LPCVD apparatus, and particularly on/in the pump/vacuum system of the LPCVD apparatus. In one embodiment, the time of which the lower alcohol composition is contacted with the TEOS material build-up is typically from about 1 second to about 1 hour. In another embodiment, the lower alcohol composition is contacted with the TEOS material build-up for a period of time from about 5 seconds to about 10 minutes. In yet another embodiment, the lower alcohol composition is contacted with the TEOS material build-up for a period of time from about 10 seconds to about 60 seconds.

In one embodiment, the liquid/gas composition containing one or more lower alcohols further contains water, a lower organic compound (an organic compound containing 1 to about 6 carbon atoms) at least one inert gas, such as nitrogen, and the noble gases. Lower organic compounds include acetone, methylethyl ketone, methylisobutyl ketone, ethyl acetate, and the like. Noble gases include argon, helium, neon, krypton, and xenon. Water is tap water or deionized water, but deionized water is preferred.

In one embodiment, the liquid/gas composition contains from about 1% to about 100% by weight of at least one lower alcohol, from about 0% to about 99% by weight of water, from about 0% to about 99% by weight of at least one lower organic compound, and from about 0% to about 99% by weight of at least one inert gas. In another embodiment, the liquid/gas composition contains from about 2% to about 75% by weight of at least one lower alcohol, optionally from about 10% to about 98% by weight of water, optionally from about 1% to about 25% by weight of at least one lower organic compound, and optionally from about 1% to about 98% by weight of at least one inert gas. In yet another embodiment, the liquid/gas composition contains from about 3% to about 50% by weight of at least one lower alcohol, optionally from about 25% to about 97% by weight of water, optionally from about 2% to about 10% by weight of at least one lower organic compound, and optionally from about 5% to about 97% by weight of at least one inert gas.

Examples of such compositions include a gas containing about 50% by weight of at least one lower alcohol and about 50% by weight of deionized water vapor; a liquid containing about 50% by weight of at least one lower alcohol, such as a pentanol, and about 50% by weight of deionized water; a liquid containing about 20% by weight of at least one lower alcohol, such as a butanol, about 70% by weight of deionized water, and about 10% by weight of a lower organic compound, such as acetone; a liquid containing about 10% by weight of at least one lower alcohol, such as a isopropanol, and about 90% by weight of deionized water; and a liquid containing about 10% by weight of at least one lower alcohol, such as ethanol, about 85% by weight of deionized water, and about 5% by weight of a lower organic compound, such as acetone.

Any suitable pressure may be employed when using the lower alcohol liquid or gas composition. In one embodiment, the pressure in the LPCVD apparatus is from about 0.001 Torr to about 800 Torr. In another embodiment, the pressure in the LPCVD apparatus is from about 0.005 Torr to about 500 Torr. In one embodiment, the pressure in the LPCVD apparatus is from about 0.01 Torr to about 100 Torr.

The temperature during contact between the lower alcohol composition and the TEOS material build-up is typically from about 10° C. to about 200° C. In one embodiment, the temperature during contact between the lower alcohol composition and the TEOS material build-up is from about 20° C. to about 150° C. In another embodiment, the temperature during contact between lower alcohol composition and the TEOS material build-up is from about 30° C. to about 100° C. The temperature is maintained to maximize the reduction of the TEOS material build-up on the LPCVD apparatus, while not substantially damaging or degrading any of the apparatus surfaces.

Comparing the interior surfaces of the LPCVD apparatus (and particularly the interior surfaces of the pump/vacuum system of the LPCVD apparatus) before and after contact with the lower alcohol composition, the interior surfaces after contact have at least about 75% less TEOS material build-up (for example, by weight) than the interior surface before contact. In another embodiment, the interior surfaces after contact have at least about 90% less TEOS material build-up than the interior surface before contact. In yet another embodiment, the interior surfaces after contact have at least about 98% less TEOS material build-up than the interior surface before contact. In still yet another embodiment, the interior surfaces after contact have no visually detectable TEOS material build-up (by the naked eye).

Once the sticky/tacky TEOS material build-up is crystallized, it can be removed from the LPCVD apparatus via the pump/vacuum system, such as by sublimation. The interior surfaces of the LPCVD apparatus and particularly the pump/vacuum system are substantially free of the sticky/tacky TEOS material build-up after treatment with a lower alcohol composition, just as if the pump/vacuum system was disassembled and cleaned in a conventional manner.

Conventional LPCVD TEOS film formation processes require pump/vacuum system disconnection and disassembly for cleaning about every 3 months. When employing the processes of the present invention in connection with LPCVD TEOS film formation processes, pump/vacuum system disconnection and disassembly for cleaning is required about every 12 months, if at all.

Figure 1B:
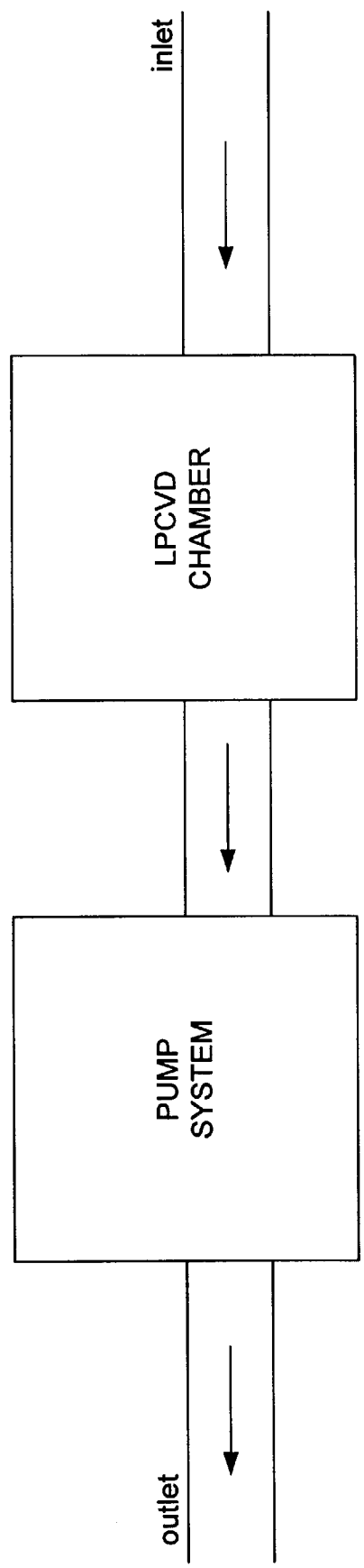
Figure 1C:
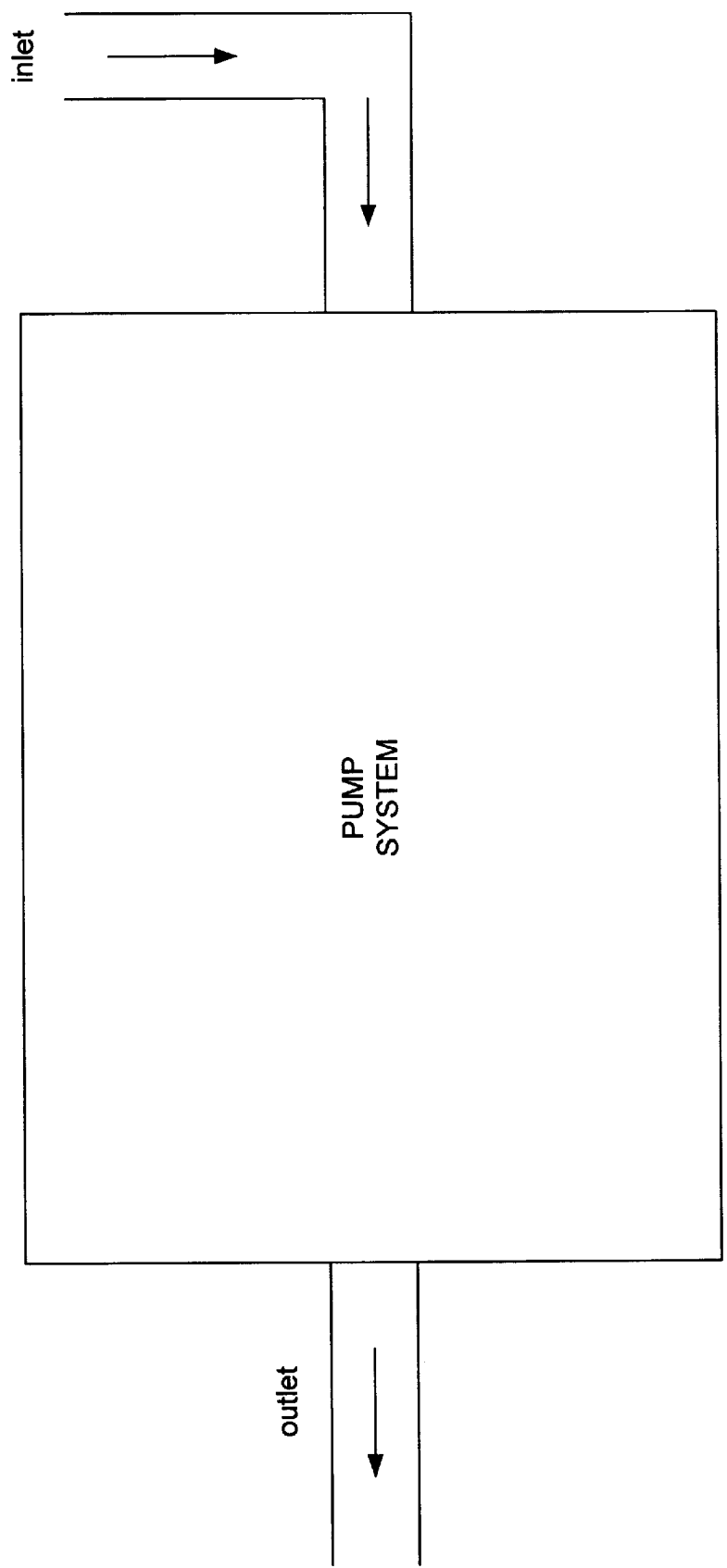

FIGS. 1A to 1C are schematic representations of systems for cleaning a low pressure chemical vapor deposition apparatus having TEOS material build-up therein. FIG. 1A specifically shows an LPCVD system that contains at least a pump system having an inlet or injection port for the lower alcohol composition and an outlet or exhaust through which the crystallized TEOS material build-up is removed. FIG. 1B specifically shows an LPCVD system that includes a pump system connected to an LPCVD chamber, the LPCVD chamber having an inlet or injection port for the lower alcohol composition wherein the crystallized TEOS material build-up is removed through the outlet or exhaust. FIG. 1C specifically shows a pump system, that may be contained within or connected to an LPCVD apparatus, containing an inlet typically connected to the LPCVD chamber, and an outlet or exhaust for removing the crystallized TEOS material build-up.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for cleaning a pump/vacuum system connected to a low pressure chemical vapor deposition apparatus, the pump/vacuum system having a sticky TEOS material build-up therein, comprising:
    a supply of a composition comprising at least one lower alcohol;
    an injection port for introducing the composition comprising at least one lower alcohol into the low pressure chemical vapor deposition apparatus; and
    the pump/vacuum system connected to the low pressure chemical vapor deposition apparatus for removing crystallized TEOS material build-up, wherein the pump/vacuum system maintains a pressure from about 0.001 Torr to about 500 Torr during cleaning.

2. The system of claim 1, wherein the low pressure chemical vapor deposition apparatus comprises a chamber and the composition comprising at least one lower alcohol is introduced into the chamber.

3. The system of claim 1, wherein the pump/vacuum system maintains a pressure from about 0.001 Torr to about 100 Torr during cleaning.

4. The system of claim 1, wherein the composition further comprises at least one of water, a lower organic compound, and an inert gas.

5. The system of claim 1, wherein the lower alcohol comprises methanol, ethanol, n-propanol, isopropanol, n-butanol, isobutanol, t-butyl alcohol, pentanol, t-pentyl alcohol, neopentanol, hexanol, cyclohexanol, 3-methyl-2-pentanol, and mixtures of two or more thereof.

6. A system for cleaning a pump/vacuum system connected to a low pressure chemical vapor deposition apparatus, the pump/vacuum system having a sticky TEOS material build-up therein, comprising:
    a supply of a gas comprising at least one lower alcohol for converting the sticky TEOS material build-up to a crystallized TEOS material build-up;
    an injection port for introducing the gas comprising at least one lower alcohol into the low pressure chemical vapor deposition apparatus; and the pump/vacuum system connected to the low pressure chemical vapor deposition apparatus for removing the crystallized TEOS material build-up, wherein the pump/vacuum system,maintains a pressure from about 0.001 Torr to about 500 Torr during cleaning.

7. The system of claim 6, wherein the pump/vacuum system maintains a pressure from about 0.05 Torr to about 500 Torr during cleaning.

8. The system of claim 6, wherein the pump/vacuum system maintains a pressure from about 0.001 Torr to about 100 Torr during cleaning.

9. The system of claim 6, wherein the gas further comprises at least one of an inert gas and water vapor.

10. The system of claim 6, wherein the lower alcohol comprises methanol, ethanol, n-propanol, isopropanol, n-butanol, isobutanol, t-butyl alcohol, pentanol, t-pentyl alcohol, neopentanol, hexanol, cyclohexanol, 3-methyl-2-pentanol, and mixtures of two or more thereof.

11. The method of claim 6, wherein the gas further comprises one of acetone, methylethyl ketone, methylisobutyl ketone, ethyl acetate, and mixtures thereof.

12. The method of claim 6, wherein the gas comprises from about 1% to about 100% by weight of at least one lower alcohol, from about 0% to about 99% by weight of water vapor, from about 0% to about 99% by weight of at least one lower organic compound, and from about 0% to about 99% by weight of at least one inert gas.

13. A system for cleaning a pump/vacuum system connected to a low pressure chemical vapor deposition apparatus, the pump/vacuum system having a sticky TEOS material build-up therein, comprising:

a supply of isopropyl alcohol for converting the sticky TEOS material build-up to a crystallized TEOS material build-up;

an injection port for introducing the isopropyl alcohol into the low pressure chemical vapor deposition apparatus; and the pump/vacuum system connected to the low pressure chemical vapor deposition apparatus for removing the crystallized TEOS material build-up, wherein the pump/vacuum system maintains a pressure from about 0.001 Torr to about 500 Torr during cleaning.

14. The method of claim 13, wherein the supply of isopropyl alcohol further comprises one of acetone, methylethyl ketone, methylisobutyl ketone, ethyl acetate, and mixtures thereof.

15. The system of claim 13, wherein the supply of isopropyl alcohol further comprises at least one of an inert gas and water.

16. The system of claim 13, wherein the pump/vacuum system maintains a pressure from about 0.001 Torr to about 100 Torr during cleaning.

17. The system of claim 13, wherein the isopropyl alcohol is in the form of a gas.

* * * * *